(12) United States Patent
Szubbocsev

(10) Patent No.: US 11,151,041 B2
(45) Date of Patent: Oct. 19, 2021

(54) TOKENS TO INDICATE COMPLETION OF DATA STORAGE

(71) Applicant: Micron Technology, Inc., Boise, ID (US)

(72) Inventor: Zoltan Szubbocsev, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 79 days.

(21) Appl. No.: 16/653,338

(22) Filed: Oct. 15, 2019

(65) Prior Publication Data

US 2021/0109858 A1    Apr. 15, 2021

(51) Int. Cl.
| | |
|---|---|
| *G06F 12/08* | (2016.01) |
| *G06F 12/0853* | (2016.01) |
| *G06F 12/0882* | (2016.01) |
| *G06F 13/16* | (2006.01) |
| *G06F 11/30* | (2006.01) |
| *G11C 11/56* | (2006.01) |

(52) U.S. Cl.
CPC ...... *G06F 12/0853* (2013.01); *G06F 11/3037* (2013.01); *G06F 11/3058* (2013.01); *G06F 12/0882* (2013.01); *G06F 13/1668* (2013.01); *G11C 11/5628* (2013.01); *G06F 2212/7201* (2013.01)

(58) Field of Classification Search
CPC ............ G06F 12/0811; G06F 11/1068; G06F 2212/1016; G06F 11/10; G11C 29/52; G11C 29/886; G11C 29/824; G11C 29/846
See application file for complete search history.

(56) References Cited

U.S. PATENT DOCUMENTS

| | | |
|---|---|---|
| 3,982,141 A | 9/1976 | Copeland |
| 4,335,447 A | 6/1982 | Jerrim |
| 5,619,671 A * | 4/1997 | Bryant ................. G06F 12/145 710/200 |
| 7,958,432 B2 | 6/2011 | Ash |
| 7,975,095 B2 | 7/2011 | Hsieh et al. |
| (Continued) | | |

OTHER PUBLICATIONS

A. Kumar, J. Ardeshana and S. Jagtap, "Design & verification of ONFI complient high performance NAND flash controller," 2016 IEEE International Conference on Recent Trends in Electronics, Information & Communication Technology (RTEICT), Bangalore, India, 2016, pp. 942-945.*

(Continued)

*Primary Examiner* — Pierre Miche Bataille
(74) *Attorney, Agent, or Firm* — Brooks, Cameron & Huebsch, PLLC

(57) ABSTRACT

Systems, apparatuses, and methods related to tokens to indicate completion of data storage to memory are described. An example method may include storing a number of data values by a first page in a first row of an array of memory cells responsive to receipt of a first command from a host, where the first command is associated with an open transaction token, and receiving a second command from the host to store a number of data values by a second page in the first row. The method may further include sending a safety token to the host to indicate completion of storing the number of data values by the second page in the first row.

26 Claims, 7 Drawing Sheets

(56) References Cited

U.S. PATENT DOCUMENTS

| | | | |
|---|---|---|---|
| 8,201,009 | B2 | 6/2012 | Sun et al. |
| 9,354,685 | B2 | 5/2016 | Stone et al. |
| 9,728,241 | B2 | 8/2017 | Ghosh et al. |
| 2008/0162795 | A1 | 7/2008 | Hsieh et al. |
| 2010/0161915 | A1* | 6/2010 | Kim .................... G06F 12/0215 711/154 |
| 2011/0016340 | A1 | 1/2011 | Sun et al. |
| 2012/0059983 | A1* | 3/2012 | Nellans ............... G06F 12/0215 711/105 |
| 2016/0307609 | A1* | 10/2016 | Harris .................... G11C 7/222 |
| 2019/0303044 | A1* | 10/2019 | Louie .................... G06F 3/0659 |
| 2019/0340125 | A1* | 11/2019 | Mondello ........... G06F 12/0811 |

OTHER PUBLICATIONS

J. Bobba, N. Goyal, M. D. Hill, M. M. Swift and D. A. Wood, "TokenTM: Efficient Execution of Large Transactions with Hardware Transactional Memory," 2008 International Symposium on Computer Architecture, 2008, pp. 127-138.*

* cited by examiner

450 ⟶

| TOKENS | | |
|---|---|---|
| 451 Name | 453 Origin | 455 Description |
| 456 — OPEN TRANSACTION TOKEN | HOST | THE OPEN TRANSACTION TOKEN ORIGINATES IN THE HOST IN ASSOCIATION WITH A FIRST COMMAND TO PROGRAM AT LEAST A NUMBER OF FIRST PAGES OF A CORRESPONDING NUMBER OF ROWS OF AN ARRAY OF MEMORY CELLS |
| 457 — CLOSE TRANSACTION TOKEN | HOST | THE CLOSE TRANSACTION TOKEN ORIGINATES IN THE HOST AND THE MEMORY DEVICE SENDS AN INDICATOR TO THE HOST TO INDICATE COMPLETION OF THE FIRST COMMAND TO PROGRAM AT LEAST THE NUMBER OF FIRST PAGES OF THE CORRESPONDING NUMBER OF ROWS TO VALIDATE THE CLOSE TRANSACTION TOKEN |
| 458 — SAFETY TOKEN | MEMORY DEVICE | THE SAFETY TOKEN ORIGINATES IN THE MEMORY DEVICE TO BE SENT TO THE HOST TO INDICATE COMPLETION OF A SECOND COMMAND TO PROGRAM A NUMBER OF SECOND PAGES ASSOCIATED WITH THE NUMBER OF FIRST PAGES ENCAPSULATED BY THE OPEN TRANSACTION TOKEN AND THE CLOSE TRANSACTION TOKEN |

*Fig. 4*

TOKENS TO INDICATE COMPLETION OF DATA STORAGE

TECHNICAL FIELD

The present disclosure relates generally to semiconductor memory and methods, and more particularly, to tokens to indicate completion of data storage to memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory storage devices can be combined together to form a solid state drive (SSD). An SSD, an embedded Multi-Media Card (eMMC) memory, or a universal flash storage (UFS) memory, can include non-volatile memory (e.g., NAND flash memory, NOR flash memory, and/or wireless memory), and/or can include volatile memory (e.g., DRAM and/or SRAM), among various other types of non-volatile and volatile memory. Flash memory devices can include memory cells storing data in a charge storage structure such as a floating gate or charge trap, for instance, and may be utilized as non-volatile memory for a wide range of electronic applications. Flash memory devices may use a one-transistor memory cell that allows for high memory densities, high reliability, and low power consumption.

Improving memory storage devices may include reducing power consumption, increasing reliability of data retention, protecting from potential modification of data values resulting from interruption of an energy supply, and/or reducing manufacturing costs, among other metrics.

BRIEF DESCRIPTION OF THE DRAWINGS

FIG. 4 illustrates a table of tokens usable by a host and a memory device in accordance with an embodiment of the present disclosure.

DETAILED DESCRIPTION

Figure 1:
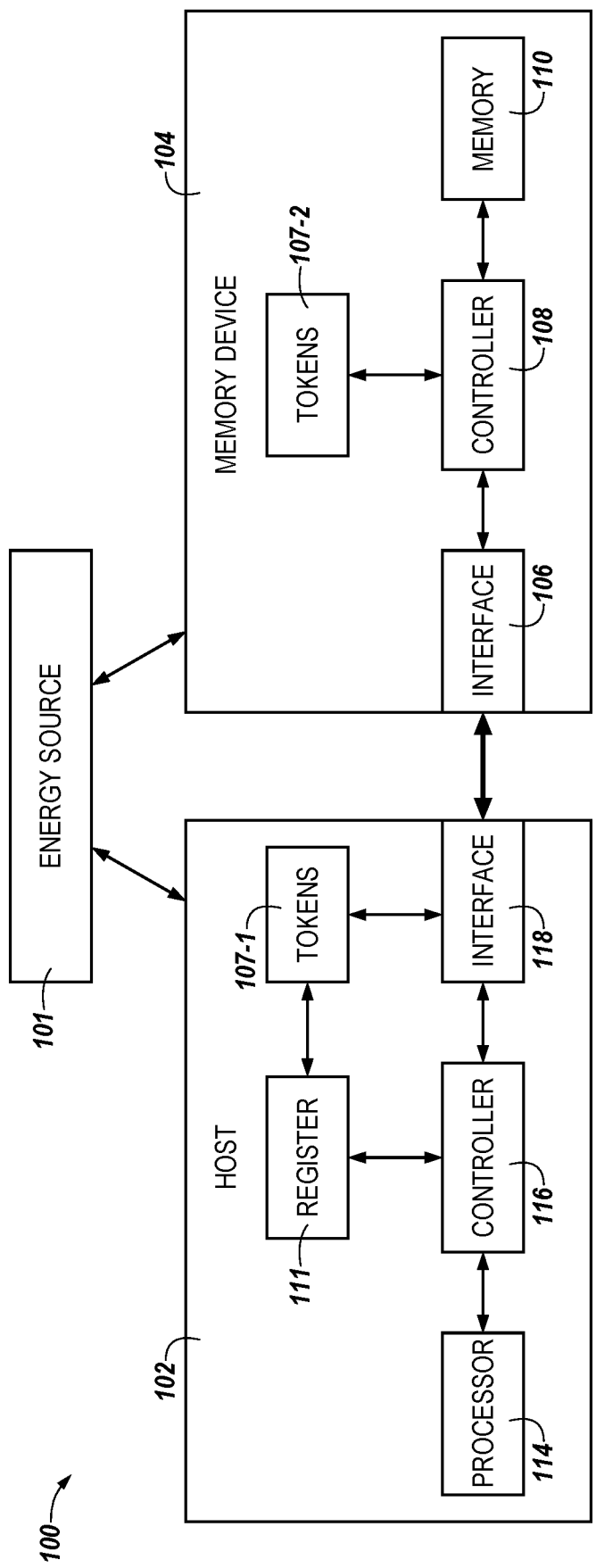
FIG. 1 illustrates a block diagram of an example computing system in accordance with an embodiment of the present disclosure.

Various types of memory devices may have conductive pathways to enable access to various components. The conductive pathways may include electrodes, access lines (e.g., word lines), and sense lines (e.g., bit lines), among other possible conductive pathways. The components accessible via the conductive pathways may include control circuitry, sense amplifiers, memory cells, transistors, and memory storage nodes (e.g., floating gates, capacitors, etc.), among other possible components, that are powered by an energy source (e.g., a source of electrical power).

For example, memory cells in a flash array architecture (NAND or NOR) may be programmed (e.g., as a result of a write operation) to a desired state. Electric charge may be placed on or removed from a floating gate or a charge trap of a memory cell to put the cell into a number of stored states for data values. A single level cell (SLC) may represent two binary states (e.g., 1 or 0). Flash memory cells also may store more than two binary states (e.g., 1111, 0111, 0011, 1011, 1001, 0001, 0101, 1101, 1100, 0100, 0000, 1000, 1010, 0010, 0110, and 1110 for a four level memory cell). Such cells may be referred to as multi state memory cells, multibit cells, or multilevel cells (MLCs). MLCs may allow the manufacture of higher density memories without increasing the number of memory cells because each cell may represent more than one bit. MLCs may have more than one programmed state. For example, a four level cell capable of storing four bits may have fifteen programmed states and an erased state.

Memory cells in a SLC flash array may each have only two potential charge levels. The two potential charge levels may correspond to the two binary states. The charge level (e.g., data value) of a non-volatile memory cell programmed to one of these binary states may be relatively stable even when the SLC flash array is shut down and/or a supply of electrical power from the energy source is interrupted. In contrast, memory cells in an MLC flash array each have more than two potential charge levels. The number of potential charge levels may correspond to two binary states for each level of the memory cells in the MLC flash array and be calculated exponentially using the number 2 as the base and the number of levels as the exponent. For example, the number of potential charge levels for a two level MLC is $2^2=4$, for a three level MLC is $2^3=8$, and for a four level MLC is $2^4=16$, etc.

As such, the potential charge levels, for example, for a two level MLC may have an erased state and three programmed states with progressively increasing electrical charges and a four level MLC may have an erased state and fifteen programmed states with progressively increasing electrical charges. The charge level (e.g., data value) of a non-volatile MLC programmed to one of these multiple binary states may be relatively unstable (e.g., compared to a SLC) in a transitional state in which one or more of the levels remain unprogrammed. For example, the transitional state may allow shifting of a voltage level corresponding to a particular data value in a programmed level when an upper and/or lower level of the MLC remains unprogrammed. Interruption of the supply of electrical power from the energy source to the MLC may prevent the upper and/or lower level of the MLC from being programmed, which may contribute to the instability of the previously programmed charge level corresponding to the data value. MLC memory stores multiple bits on each cell by using different threshold levels for each state that is stored. The difference between adjacent threshold voltage distributions may be very small compared to SLC memory. Therefore, the effect of electrical power interruption preventing programming of the upper and/or lower level of the MLC may increase a probability of unintended modification (e.g., loss, corruption, etc.) of the previously programmed data value.

A row of MLCs in, for example, a NAND array may be formed from a sequence of non-volatile MLCs (e.g., 4,096 memory cells, 8,192 memory cells, 16,384 memory cells, etc.) that each have multiple levels for storage of potential charge levels corresponding to the multiple bits storable on each cell. In a row of two level MLCs, a first level in each MLC may collectively be referred to as a first page (e.g., an upper page) for storage of data values corresponding to a first bit and a second level in each MLC may collectively be referred to as a second page (e.g., a lower page) for storage of data values corresponding to a second bit.

A host may be coupled to a memory device that includes the MLC array. The host may be configured to send data (e.g., data values) to the memory device and/or MLC array for storage in particular logical locations (e.g., corresponding to particular physical addresses of MLCs and/or pages in the array). Such a host may be configured to monitor stability or instability (e.g., safety) of the data intended to be programmed (e.g., written) to the MLCs of the array. The safety of the data stored in a first page may, for example, be compromised when an electrical power interruption prevents programming of second page (e.g., an upper page and/or lower page) of the MLC due, for example, to the potential shifting of voltage levels in the transitional state. Consequently, monitoring by the host of whether the programming of the second page has been completed following programming of the first page may indicate whether an intervening interruption of electrical power has occurred.

If no such interruption of electrical power (or other event that prevents programming) has occurred and/or the first and second pages have been programmed, the host may determine safety of the data on the first page (and the second page) based on the data being safely stored by the intended MLCs and/or pages of the array. Such a determination may, as described herein, enable the host to subsequently send additional data to the memory device for storage in the MLC array.

Determination of such an interruption of electrical power may, as described herein, prevent the host from again sending data to the memory device for storage in MLC array. For example, when interruption of electrical power (or another event) has been determined to occur to prevent programming of the second page, the host may determine that the data of the first page is not safely stored and the host may delay (e.g., stop) sending additional data. The host may send the previously sent data again, and the additional data, after restoration of the electrical power supply and/or may direct the memory device to recover the previously sent data from backup data storage components (e.g., backup memory pages of SLC, capacitors, etc.). In implementations in which there are backup data storage components, these components may be used for storage of data (associated with commands) as the data is provided to the memory device to enable retrieval of the stored data values for programming of the MLC memory. Such retrieval of the data values from backup data storage components (e.g., after restoration of the electrical power supply) may be performed in situations where input of the commands and/or data from the host has previously been interrupted.

In contrast, in a number of embodiments of the present disclosure, a computing system including MLC memory (e.g., as shown at 100 and 110, respectively, and described in connection with FIG. 1) may be configured so as to not include backup data storage components (e.g., backup memory) based on using the tokens to indicate completion of data storage to MLC memory, as described herein. The tokens described herein may be used to indicate (e.g., ensure) that data, corresponding to commands from the host, has not only been programmed (e.g., written) to appropriate locations (levels in the MLC memory) but has been safely programmed. A computing system configured as such may save bandwidth and/or increase endurance by decreasing unnecessary attempts and/or repeated attempts at data programming following, for example, interruption of electrical power. Along with not including backup data storage components, saving the bandwidth and/or increasing endurance as such may contribute to reduction of manufacturing and/or operating costs.

The present disclosure includes systems, apparatuses, and methods related to tokens to indicate completion of data storage to memory. An example of a method described herein includes storing a number of data values by a first page in a first row of an array of memory cells responsive to receipt of a first command from a host, where the first command is associated with an open transaction token, and receiving a second command from the host to store a number of data values by a second page in the first row. The method may further include sending a safety token to the host to indicate completion of storing the number of data values by the second page in the first row.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the figure number of the drawing and the remaining digits identify an element or component in the drawing. Similar elements or components between different figures may be identified by the use of similar digits. For example, 104 may reference element "04" in FIG. 1 and a similar element may be referenced as 504 in FIG. 5. In some instances, a plurality of similar, but functionally and/or structurally distinguishable, elements or components in the same figure or in different figures may be referenced sequentially with the same element number (e.g., 221-1 and 221-2 in FIG. 2). Additionally, the designators "B", "M", "N", "R", and "S" used herein, particularly with respect to reference numerals in the drawings, are intended to indicate that one or more of the particular feature so designated can be included with embodiments of the present disclosure.

FIG. 1 illustrates a block diagram of a computing system 100 in accordance with an embodiment of the present disclosure. As shown in FIG. 1, computing system 100 may include a host 102 and an apparatus in the form of a memory device 104. As used herein, an "apparatus" may refer to, but is not limited to, any of a variety of structures or combinations of structures, such as a circuit or circuitry, a die or dice, a module or modules, a device or devices, or a system or systems, for example. The computing system 100 may include an energy source 101 (e.g., a battery, a capacitor, an electrical power outlet, etc.). The host 102 and the memory device 104 may be coupled to an energy source 101 to provide energy (e.g., electrical power) to the host 102 and the memory device 104. In a number of embodiments, the host 102 and the memory device 104 may be coupled to different energy sources.

Host 102 may include a memory, such as RAM (not shown so as not to obscure embodiments of the present disclosure) and a memory access device, such as a processor 114. The processor 114 may represent one or more processors, such as a parallel processing system, one or more coprocessors, etc. Example hosts may include laptop computers, personal computers, digital cameras, digital recording and playback devices, mobile devices (e.g., smart phones, tablets, etc.), personal digital assistants (PDAs), memory card readers, interface hubs, and the like.

As shown in FIG. 1, host 102 may include a file register (e.g., as shown at register 111) to store indicators of logical locations of the data values stored by a memory 110 of the memory device 104 in response to commands (CMDs) sent by the host 102 to a controller 108 of the memory device 104. Host 102 may further include a first token component 107-1, as will be described further herein, to serve as a source for origin (e.g., creation, storage, updating, etc.) of tokens usable in monitoring completion of data storage. The completion of data storage may indicate protection (e.g., safety) of the respective data values from unintended modification as a result, for example, of interruption of energy supplied to the memory device 104 prior to completion of the data storage.

As shown in FIG. 1, host 102 may include a controller 116 directly or indirectly coupled to processor 114, file register 111, and the first token component 107-1. Host 102 may further include an interface 118 directly or indirectly coupled to controller 116, file register 111, and first token component 107-1. Although not shown in FIG. 1 so as not to obscure embodiments of the present disclosure, host 102 also may include and/or be configured to implement an application that communicates with memory device 104 using a driver (e.g., a universal flash storage (UFS) driver). The driver may manage controller 116 through a UFS host controller interface (not shown).

As shown in FIG. 1, memory device 104 may include an interface 106 directly or indirectly coupled to a controller 108, a second token component 107-2, and a memory 110. Controller 108 may be coupled to memory 110 and the second token component 107-2. The second token component 107-2, as will be described further herein, may serve as a source for origin (e.g., creation, storage, updating, etc.) of tokens usable, in combination with the tokens from the first token component 107-1, in monitoring the completion of data storage.

In a number of embodiments, memory device 104 may be a UFS memory device. A UFS memory device may be, for example, a memory card (full or micro size), an embedded bootable mass storage device, or an IO device. Although not shown so as not to obscure embodiments of the present disclosure, a UFS device also may include multiple logical units (LUs) and a device manager. The device manager may perform device level functions such as power management and monitoring, the LUs may perform functions such as writes and reads of data to and from memory 110, and the file register 111 may store related information. Further, although one memory 110 is shown in FIG. 1, embodiments of the present disclosure are not so limited (e.g., memory device 104 may include more than one memory coupled to controller 108).

Interfaces 106 and 118 may be used to communicate information (e.g., data) between host 102 and memory device 104. For example, interfaces 106 and 118 may provide an interface for passing control, address, information (e.g., data), tokens, indicators, and other signals between memory device 104 and host 102.

In a number of embodiments, interfaces 106 and 118 may be physical interfaces, such as standardized physical interfaces. For example, when memory device 104 is used for information storage in computing system 100, interfaces 106 and 118 may be UFS interfaces, serial advanced technology attachment (SATA) physical interfaces, peripheral component interconnect express (PCIe) physical interfaces, or universal serial bus (USB) physical interfaces, among other physical connectors and/or interfaces. For example, when interfaces 106 and 118 are UFS interfaces, interfaces 106 and 118 may include a UFS interconnect (UIC) layer between host 102 and memory device 104 that includes MIPI UniPro and MIPI M-PHY. The physical layer M-PHY may be a differential, dual simplex PHY that includes TX and RX pairs. In such embodiments, memory device 104 may receive energy from, and/or communicate information with, host 102 through a wired connection with host 102 (e.g., host 102 and memory device 104 may be coupled through a wired connection).

Controller 108 may communicate with memory 110 to sense (e.g., read), program (e.g., write), and/or erase information, among other operations. Controller 108 may include, for example, control circuitry and/or logic (e.g., hardware and/or firmware). Controller 108 may be included on the same physical device (e.g., the same die) as memory 110, or may be included on a separate physical device that is communicatively coupled to the physical device that includes memory 110. In a number of embodiments, components of controller 108 may be spread across multiple physical devices (e.g., some components on the same die as memory 110, and some components on a different die, module, or board).

Memory 110 may include, for example, one or more non-volatile memory arrays (e.g., which may include one or more non-volatile memory cells). For example, memory 110 may be flash memory with a NAND architecture. Examples of memory 110 will be further described herein (e.g., in connection with FIGS. 2 and 3A-3B). However, embodiments of the present disclosure are not limited to a particular type of memory or memory device. For example, memory 110 may, in a number of embodiments, be NOR, SRAM, DRAM, RRAM, FeRAM, and/or PCRAM, among other types of volatile and non-volatile memory.

In a NAND architecture, the control gates of memory cells of a "row" may be coupled with an access (e.g., word) line, while the memory cells may be coupled in series source to drain in a "string" between a select gate source transistor and a select gate drain transistor. The string may be connected to a data sense (e.g., bit) line by the select gate drain transistor. The use of the terms "row" and "string" implies neither a linear nor an orthogonal arrangement of memory cells. As will be appreciated by those of ordinary skill in the art, the manner of connection of the memory cells to the bit lines and source lines depends on whether the array is a NAND architecture, a NOR architecture, or some other memory array architecture.

The memory array(s) of memory 110 may include one or more memory cells that may be grouped. As used herein, a group may include one or more memory cells, such as a page, block, plane, die, an entire array, or other groups of memory cells. For example, some memory arrays may include one or more of pages of memory cells that make up a block of memory cells. One or more blocks may be included in a plane of memory cells, and one or more planes of memory cells may be included on a die. As an example, a 128 gigabyte memory device may include 4320 bytes of information per page, 128 pages per block, 2048 blocks per plane, and 16 planes per device.

The embodiment illustrated in FIG. 1 may include additional circuitry that is not illustrated so as not to obscure embodiments of the present disclosure. For example, memory 110 may include address circuitry to latch address signals provided over input/output (I/O) connectors through I/O circuitry. Address signals may be received and decoded by a row decoder and a column decoder, to access memory 110 (e.g., the array(s) of memory 110).

Complementary to using the tokens described herein to indicate completion of data storage, which are used for protection from potential interruption of energy supplied from the energy source 101, host 102 (e.g., processor 114 and/or controller 116) may determine energy information for memory device 104 (e.g., memory 110) and provide the energy information to memory device 104 (e.g., controller 108). For example, host 102 may process information including the characteristics (e.g., type) of its energy source 101 (e.g., whether its battery is removable or non-removable), the charge level, the capacity (e.g., charge storage capacity), the characteristics of system 100 and its user activity (e.g., rate of system power drain due to, for example, the display being on or off), whether the energy source is currently charging, whether the energy currently being provided to memory device 104 is unlimited (e.g., since host 102 is plugged in to a socket), and/or the age of its energy source. Host 102 may use this processed information to determine whether it is necessary for memory device 104 to perform power loss protection operations (e.g., sudden power off recovery operations) to protect data that has been programmed and/or is in the process of being programmed to memory 110 from sudden and/or unexpected energy loss, and/or to determine whether a sufficient amount of energy is available from its energy source 101 to sustain normal operations. Host 102 may then provide this determination(s) to memory device 104, using a single data bit, for example.

Figure 2:
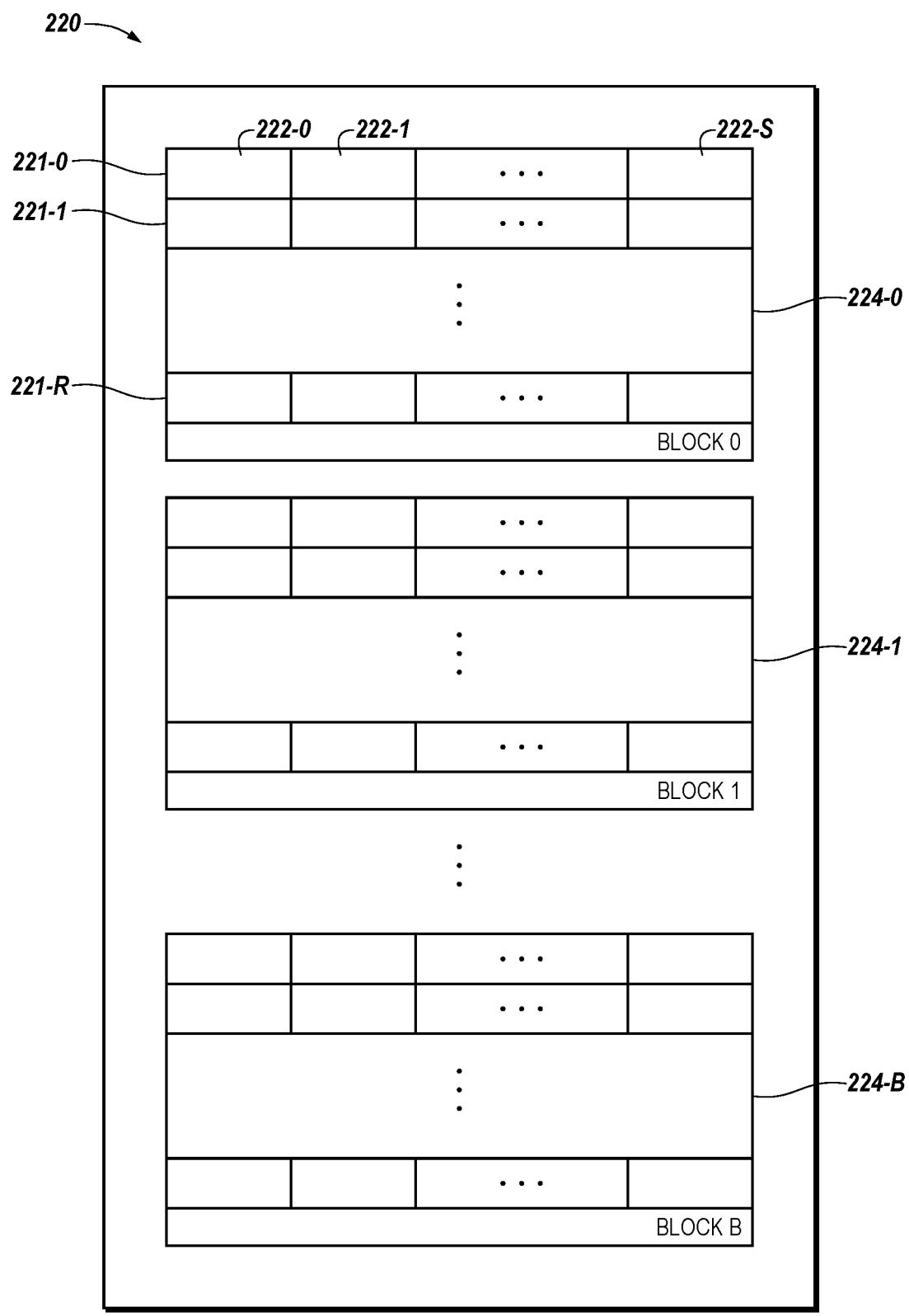
FIG. 2 illustrates a diagram of a portion of an example memory array in accordance with an embodiment of the present disclosure.

FIG. 2 illustrates a diagram of a portion of an example memory array 220 in accordance with an embodiment of the present disclosure. Memory array 220 may, in a number of embodiments, be memory 110 previously described in connection with FIG. 1. Further, although not shown in FIG. 2, memory array 220 may be located on a particular semiconductor die along with various peripheral circuitry associated with the operation thereof.

As shown in FIG. 2, memory array 220 may include one or more physical blocks 224-0 (BLOCK 0), 224-1 (BLOCK 1), . . . , 224-B (BLOCK B) of memory cells. The memory cells may include SLCs and/or MLCs such as, for example, two level cells, three level or triple level cells (TLCs), and/or four level or quadruple level cells (QLCs), among other possibilities. For example, the number of physical blocks in memory array 220 may be 128 blocks, 512 blocks, or 1,024 blocks, but embodiments are not limited to a particular power of two or to any particular number of physical blocks in memory array 220.

One or more physical blocks of memory cells (e.g., blocks 224-0, 224-1, . . . , 224-B) may be included in a plane of memory cells, and one or more planes of memory cells may be included on a die. For example, in the example shown in FIG. 2, each physical block 224-0, 224-1, . . . , 224-B may be part of a single die. That is, the portion of memory array 220 illustrated in FIG. 2 may be die of memory cells.

As shown in FIG. 2, each physical block 224-0, 224-1, . . . , 224-B includes one or more physical rows (e.g., 221-0, 221-1, . . . , 221-R) of memory cells coupled to access lines (e.g., word lines). The number of rows (e.g., word lines) in each physical block may be 32, but embodiments are not limited to a particular number of rows 221, 221-1, . . . , 221-R per physical block. Further, although not shown in FIG. 2, the memory cells may be coupled to sense lines (e.g., bit lines, data lines, and/or digit lines).

In a number of embodiments, each row 221-0, 221-1, . . . , 221-R may include one or more pages of memory cells (e.g., physical pages). A physical page refers to a unit of programming and/or sensing (e.g., one or more memory cells that are programmed and/or sensed together as a functional group). In the embodiment shown in FIG. 2, each row 221-0, 221-1, . . . , 221-R appears to show one physical page of memory cells; however, embodiments of the present disclosure are not so limited. For example, in a number of embodiments, each row may include multiple physical pages of memory cells (e.g., one or more even pages of memory cells coupled to even-numbered bit lines, and one or more odd pages of memory cells coupled to odd numbered bit lines). Additionally, for embodiments including MLCs, a row (physical page) of memory cells may store multiple pages (e.g., logical pages) of data. For example, a row of two level MLCs may store an upper page of data and a lower page of data, with each cell in a physical page storing one or more bits towards an upper page of data and one or more bits towards a lower page of data.

As shown in FIG. 2, a physical page of memory cells may include one or more physical sectors 222-0, 222-1, . . . , 222-S (e.g., subsets of memory cells). Each physical sector 222-0, 222-1, . . . , 222-S of cells may store one or more logical sectors of data (e.g., data words). Additionally, each logical sector of data may correspond to a portion of a particular page of data. For example, a first logical sector of data stored in a particular physical sector may correspond to a logical sector corresponding to a first page of data, and a second logical sector of data stored in the particular physical sector may correspond to a second page of data. Each physical sector 222-0, 222-1, . . . , 222-S may store system and/or user data and/or may include overhead data, such as error correction code (ECC) data and logical block address (LBA) data.

Other configurations for the physical blocks 224-0, 224-1, . . . , 224-B, rows 221-0, 221-1, . . . , 221-R, sectors 222-0, 222-1, . . . , 222-S, and pages are possible. For example, rows 221-0, 221-1, . . . , 221-R of physical blocks 224-0, 224-1, . . . , 224-B may each store data corresponding to a single logical sector which may include, for example, more or less than 512 bytes of data.

Figure 3A:
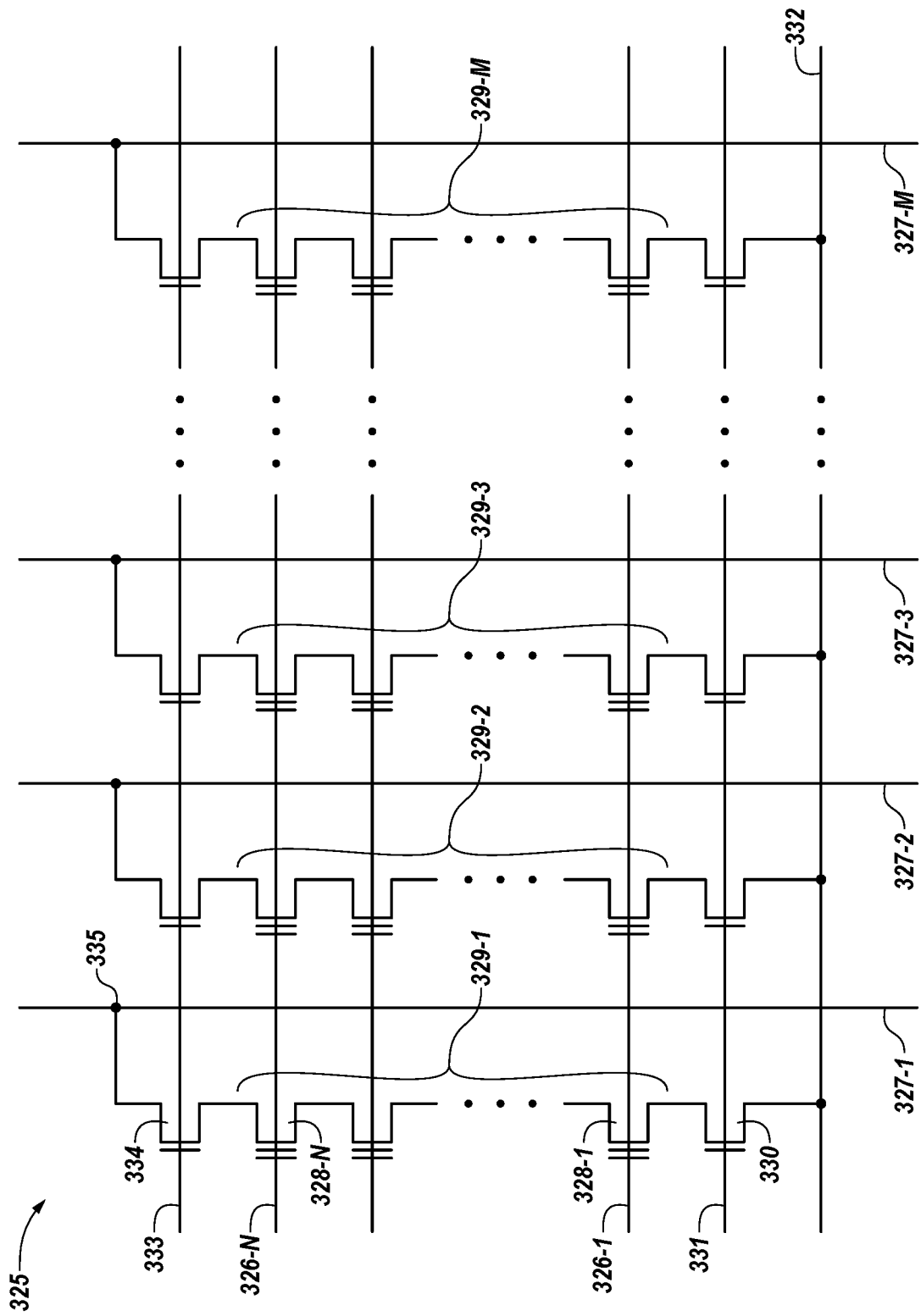
FIG. 3A is a schematic of a portion of an example non-volatile memory array in accordance with an embodiment of the present disclosure.

FIG. 3A is a schematic of a portion of an example non-volatile memory array 325 in accordance with an embodiment of the present disclosure. The embodiment of FIG. 3A illustrates NAND architecture non-volatile memory; however, embodiments described herein are not limited to this example. Memory array 325 may, in a number of embodiments, be memory 110 and/or 220 previously described in connection with FIGS. 1 and 2. As shown in FIG. 3A, the memory array 325 includes access lines (word lines) 326-1, . . . , 326-N and intersecting sense lines (bit lines) 327-1, . . . , 327-M. For ease of addressing in the digital environment, the number of word lines 326-1, . . . , 326-N and the number of bit lines 327-1, . . . , 327-M are each some power of two (e.g., 256 word lines by 4,096 bit lines).

Memory array 325 includes NAND strings 329-1, . . . , 329-M. Each NAND string 329-1, . . . , 329-M includes non-volatile memory cells 328-1, . . . , 328-N, each located at an intersection of a word line 326-1, . . . , 326-N and a local bit line 327-1, . . . , 327-M. The non-volatile memory cells 328-1, . . . , 328-N of each NAND string 329-1, . . . , 329-M are connected in series source to drain between a source select gate (SGS) 330 (e.g., a field-effect transistor (FET)), and a drain select gate (SGD) 334 (e.g., a FET). Source select gate 330 is located at the intersection of a local bit line 327-1 and a source select line 331 while drain select gate 334 is located at the intersection of a local bit line 327-1 and a drain select line 333.

As illustrated in FIG. 3A, a source of source select gate 330 may be connected to a common source line 332. A drain of source select gate 330 may be connected to the source of the memory cell 328-1 of the corresponding NAND string 329-1. A drain of drain select gate 334 may be connected to the local bit line 327-1 for the corresponding NAND string 329-1 at drain contact 335. The source of drain select gate 334 may be connected to the drain of the last memory cell 328-N (e.g., floating-gate transistor) of the corresponding NAND string 329-1.

In a number of embodiments, construction of non-volatile memory cells 328-1, . . . , 328-N may include a source, a drain, a floating gate or charge storage layer, and a control gate. Non-volatile memory cells 328-1, . . . , 328-N have their control gates coupled to a respective word line 326-1, . . . , 326-N. A column of the non-volatile memory cells 328-1, . . . , 328-N make up the NAND strings 329-1, . . . , 329-M that may be respectively coupled to a given local bit line 327-1, . . . , 327-M. A row of the non-volatile memory cells is commonly coupled to a given word line 326-1, . . . , 326-N.

Figure 3B:
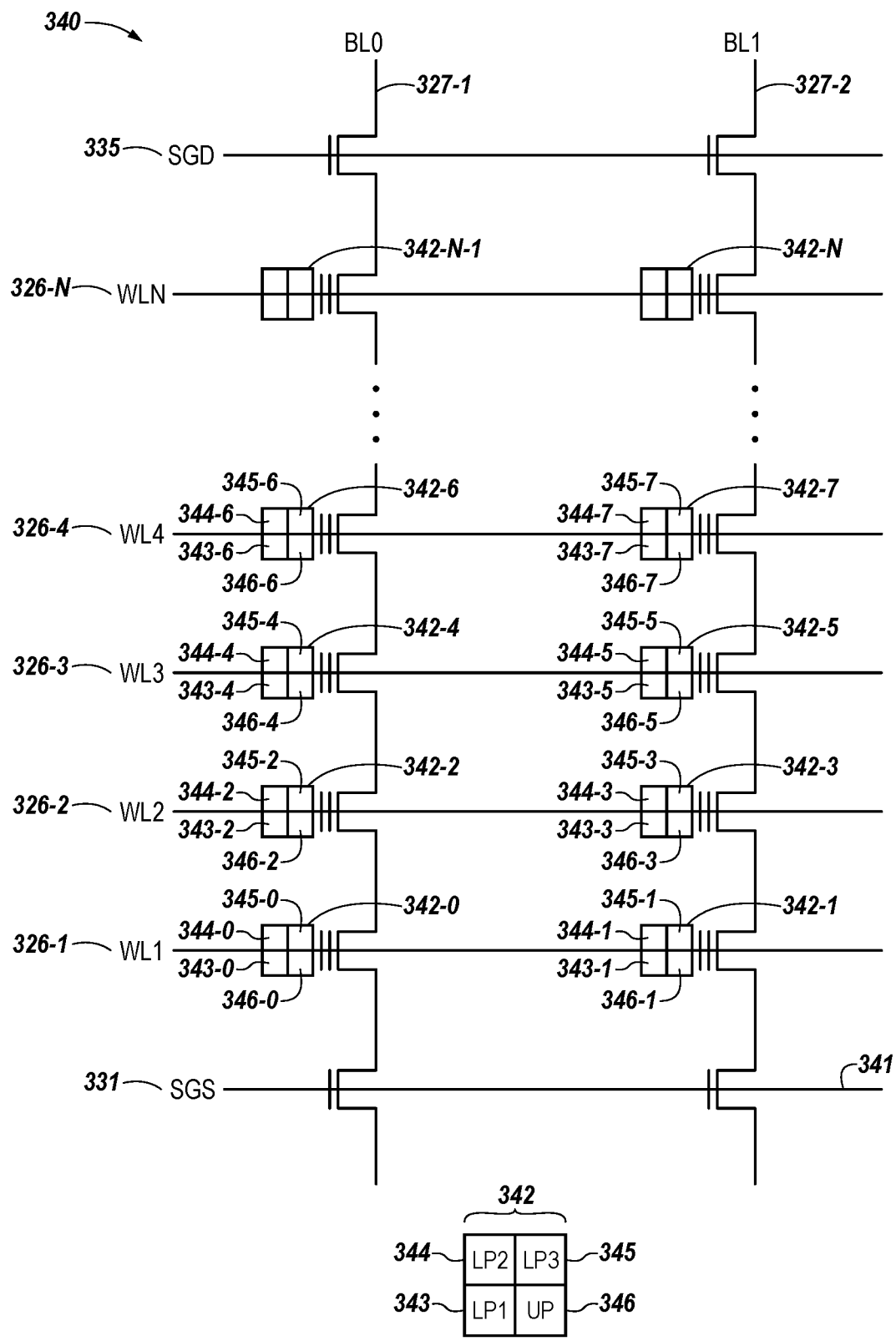
FIG. 3B is a schematic of a portion of an example non-volatile memory array of four level non-volatile memory cells in accordance with an embodiment of the present disclosure.

FIG. 3B is a schematic of a portion of an example of a NAND array 340 of four level memory cells in accordance with an embodiment of the present disclosure. NAND array 340 may, in a number of embodiments, be memory 110, 220, and/or 325 previously described in connection with FIGS. 1, 2, and 3A.

FIG. 3B illustrates an embodiment of a NAND array 340 of four bit non-volatile memory cells, the four bits corresponding to the four levels 343, 344, 345, and 346 of each MLC 342 described in connection with FIG. 3B. The bit lines BL0 327-1 and BL1 327-2 shown in FIG. 3B may correspond to the individual bit lines 327-1, . . . , 327-M described in connection with FIG. 3A. In a number of embodiments, bit lines BL0 327-1 and BL1 327-2 may represent even and odd bit lines corresponding to a respective programming sequence.

For each MLC 342 illustrated in FIG. 3B, the lower left number 343 is intended to represent a first lower page (LP1) of programmed data, the upper left number 344 is intended to represent a second lower page (LP2) of programmed data, the upper right page 345 is intended to represent a third lower page (LP3) of programmed data, and the lower right page 346 is intended to represent an upper page (UP) of programmed data. Such a description is intended to enable distinguishing different program states in the MLCs and is not intended to be limiting to a particular physical structure or sequence of the floating gates in the MLC, nor to an order in which they are programmed. For example, among the four pages, an upper page may be a first page to be programmed or a last page to be programmed (e.g., depending on preferences in programming designs and terminology to be applied to each level, among other considerations).

The embodiment of FIG. 3B illustrates beginning with a first word line (WL1) 326-1 adjacent to a SGS line 331 of the NAND array 340 and alternating between programming a first 343, a second 344, and a third lower page 345, and an upper page 346 for MLCs 342 associated with even BL0 327-1 and odd BL1 327-2 between a number of next adjacent word lines (e.g., WL1 326-1, WL2 326-2, . . . , WLN 326-N).

The embodiment illustrated in FIG. 3B may represent first programming a first lower page (LP1) at 343-0 of MLC 342-0 on the even BL0 327-1 and a first lower page (LP1) at 343-1 of MLC 342-1 on the odd BL1 327-2 associated with a first word line (WL1) at 326-1. The embodiment may represent next programming LP1 343-2 of MLC 342-2 on the even BL0 327-1 and LP1 343-3 of MLC 342-3 on the odd BL1 327-2 associated with second WL2 at 326-2. The embodiment may represent next programming LP1 343-4 of MLC 342-4 on the even BL0 327-1 and LP1 343-5 of MLC 342-5 on the odd BL1 327-2 associated with third WL3 at 326-3. In a number of embodiments, this sequence of programming may continue until the first lower pages of MLCs 342-N-1 and 342-N associated with the last WLN at 326-N have been programmed.

A similar sequence may, in a number of embodiments, then be performed for programming the second lower pages (LP2) at 344-0, 344-1, etc., of MLCs 342-0, . . . , 342-N associated with WLs 326-1, . . . , 326-N. A sequence may then be performed to program the third lower pages (LP3) at 345-0, 345-1, etc., of MLCs 342-0, . . . , 342-N associated with WLs 326-1, . . . , 326-N. The programming of each level of the MLCs 342-0, . . . , 342-N may then be completed with a sequence of programming the upper pages (UP) at 346-0, 346-1, etc., of MLCs 342-0, . . . , 342-N associated with WLs 326-1, . . . , 326-N.

There may be a notable delay between a controller of a memory device (e.g., controller 108 of memory device 104 shown and described in connection with FIG. 1) receiving a command from a host (e.g., host 102 shown and described in connection with FIG. 1) for programming MLCs 342 in a NAND array 340 and completion of programming each of the different (e.g., paired) levels in a particular MLC 342. An interruption of energy (e.g., electrical power) may occur in the delay between programming a lower page of one or more of the MLCs and programming of an upper page of one or more of the MLCs such that at least some of the upper pages may not have been programmed prior to the interruption even though some of the paired lower pages were programmed. Consequently, there may be an increased probability of unintended modification of the data values stored by the lower pages as a result of the data values not being programmed in the paired upper pages relative to the paired upper pages being successfully programmed. Use of the tokens described herein to indicate completion of data storage to memory is intended to decrease the probability of such unintended modification of the data values stored by the lower pages.

FIG. 4 illustrates a table of tokens 450 usable by a host and a memory device in accordance with an embodiment of the present disclosure. The tokens 450 in the table are listed by a name 451, an origin 453, and a description 455 for each type of token. The origin 453 is intended to indicate a source for creation, storage, updating, etc., of particular tokens usable in monitoring completion of data storage.

An open transaction token 456 may originate in a host (e.g., be created, stored, and/or updated using the first token component 107-1 of the host as shown at 102 in FIG. 1) in association with a first command to program (e.g., write/store data values in) at least a number of first pages of a corresponding number of rows of an array of memory cells. A close transaction token 457 also may originate in the host (e.g., be created, stored, and/or updated using the first token component 107-1). In a number of embodiments, the open transaction token 456 and/or the close transaction token 457 may be stored and/or updated in the first token component 107-1 and/or in a file register (e.g., register 111 shown on the host 102 in FIG. 1).

In a number of embodiments, a memory device (e.g., a controller 108 of memory device 104 and/or firmware (not shown) coupled to the memory device/controller) may send an indicator (e.g., as shown at 571 and described in connection with FIG. 5) to the host to indicate completion of the first command to program at least the number of first pages of the corresponding number of rows. The indicator may be a signal (e.g., corresponding to a particular sequence of bits) sent to a file register (e.g., register 111 shown on the host 102 in FIG. 1). In a number of embodiments, the indicator may be sent via an interface of the memory device and an interface of the host (e.g., as shown at 106 and 118, respectively, in FIG. 1). The indicator may, in a number of embodiments, then be sent (e.g., by a controller 116 shown in FIG. 1) to the file register. The indicator may enable validation of the close transaction token 457 to indicate successful completion of the first command to program the first pages.

Figure 5:
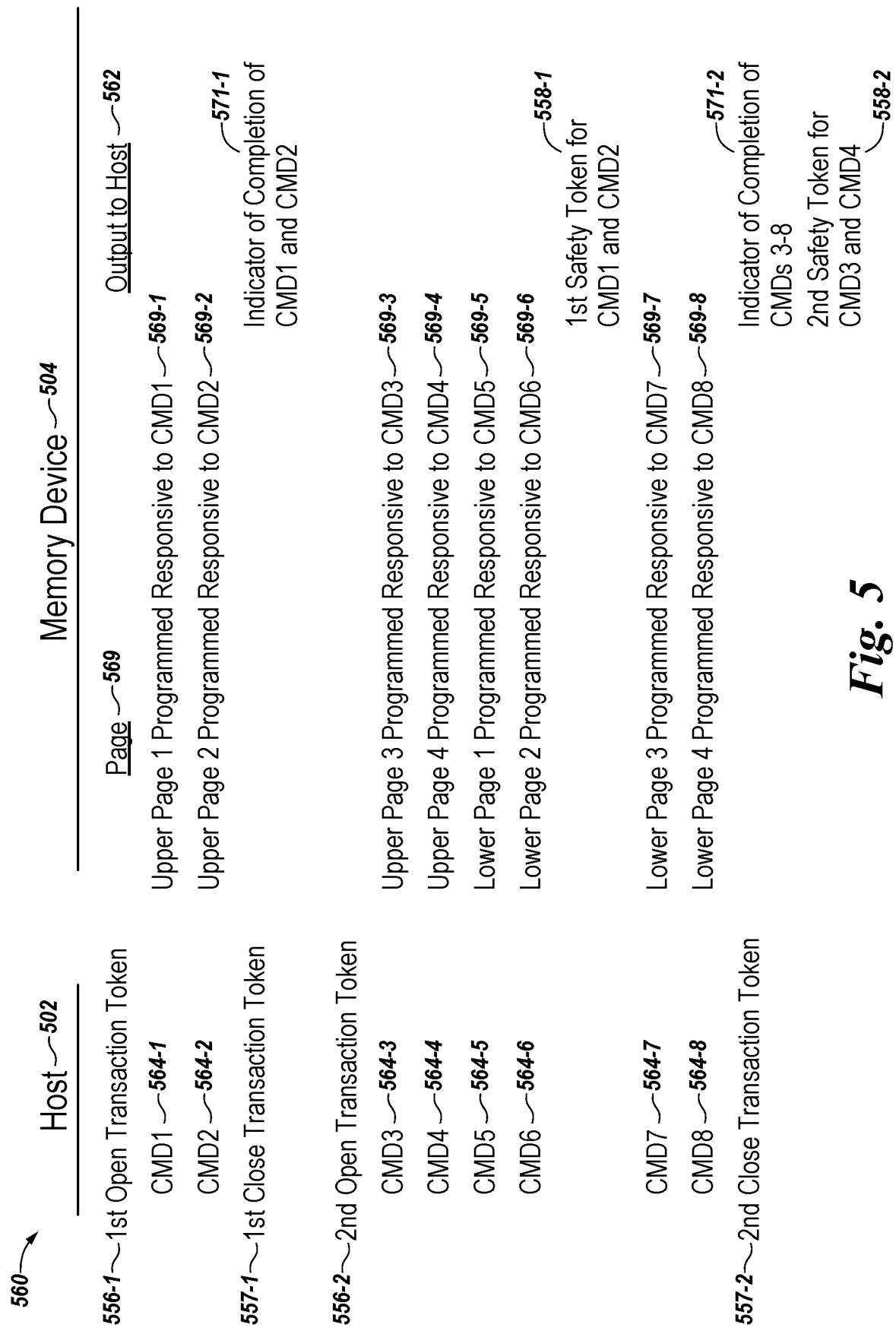
FIG. 5 illustrates an example sequence of using the tokens by a host and a memory device in accordance with an embodiment of the present disclosure.

A safety token 458 may originate in a memory device (e.g., be created, stored, and/or updated using the second token component 107-2 of the memory device as shown at 104 in FIG. 1). The safety token 458 may be sent by the memory device (e.g., by the controller and/or the firmware) to the host to indicate completion of a second command to program a number of second pages associated with the number of first pages encapsulated by the open transaction token 456 and the close transaction token 457. To be "encapsulated" by an open transaction token 456 and a close transaction token 457 is intended to mean that however many first pages of a corresponding plurality of MLCs are directed to be programmed in a first command associated with the open transaction token have been successfully programmed, as indicated by the indicator being sent to validate a corresponding close transaction token 457. An open transaction token 456 and a close transaction token 457 each may correspond to one or more first pages of the corresponding number of rows, for example, as shown in FIG. 5 for command (CMD) 1 at 564-1 and CMD 2 at 564-2 associated with first open transaction token 556-1 and first close transaction token 557-1. The number of second pages associated (e.g., paired) with the number of first pages (e.g., pages 569-1 and 569-2 in FIG. 5) encapsulated by the open transaction token 556-1 and the close transaction token 557-1 in FIG. 5 are second pages 569-5 and 569-6 associated with CMD 564-5 and CMD 564-6, respectively.

The associated safety token 458 (e.g., as shown for first safety token 558-1 corresponding to CMD 1 at 564-1 and CMD 2 at 564-2 in FIG. 5) may indicate that the programming of the paired second page (e.g., pages 569-5 and 569-6) has been successfully completed following programming of the first page (e.g., pages 569-1 and 569-2). Issuing the associated safety token 458 also may indicate that an intervening interruption of electrical power has not occurred. In a number of embodiments, receipt (e.g., by the file register 111 on the host 102 shown in FIG. 1) of the safety token 458 may result in cancelling the open transaction token 456 (e.g., first open transaction token 556-1) by indicating the successful completion of storing the number of data values by the second page (e.g., pages 569-5 and 569-6).

FIG. 5 illustrates an example sequence 560 of using tokens by a host 502 and a memory device 504 in accordance with an embodiment of the present disclosure. In a number of embodiments, the tokens 450 shown and described in connection with FIG. 4 may correspond to (e.g., be the same as) the tokens shown and described in connection with FIG. 5. The positioning in FIG. 5 of the transaction tokens and indicators under the host 502 and the memory device 504 headers is intended to indicate each of their origins (e.g., as shown at 453 and described in connection with FIG. 4).

The example sequence 560 illustrated in FIG. 5 shows the host 502 issuing CMD1 at 564-1 and CMD2 at 564-2 associated with a first open transaction token 556-1. The two commands in the subsequence of the example sequence 560 each include data values to be programmed to a particular page 569 of an array of MLCs. In addition to instructions as to which row, column, page, etc., of the array to program, each command may include a number of data values to program that may correspond to a number of MLCs in a row of the array. Each of the different levels (e.g., the four levels of the MLCs 342 shown and described in connection with FIG. 3B) in the number of MLCs in the row may collectively be termed a page 569, such that the rows associated with WL1 326-1, WL2 326-2, . . . , WLN 326-N shown in FIG. 3B each may have four pages 569 (e.g., LP1 343, LP2 344, LP3 345, and UP 346) for storage of a number of data values corresponding to the number of MLCs in the row. For clarity, the example sequence 560 in FIG. 5 is illustrated as having two pages 569 (e.g., an upper page and a lower page) corresponding to the two levels in the MLCs in each row; however, embodiments are not limited to two pages for each row and/or two levels in each MLC.

The two commands 564-1 and 564-2 associated with the first open transaction token 556-1 may be sent consecutively (e.g., in two consecutive cycles of the host 502) to memory device 504 to be programmed (e.g., written) to the appropriate page 569 (e.g., as received and/or directed by controller 108 shown in FIG. 1). Consistent with the instructions included in the two commands 564-1 and 564-2, upper page 1 (e.g., of MLCs in row 1) at 569-1 may be programmed with data values responsive to CMD1 and upper page 2 (e.g., of MLCs in row 2) at 569-2 may be programmed with data values responsive to CMD2. Upon completion of the programming of upper page 1 at 569-1 and upper page 2 at 569-2, the memory device 504 (e.g., controller and/or firmware thereof) may be configured to output 562 to host 502 an indicator 571-1 of completion of CMD1 and CMD2.

Receipt by the host 502 (e.g., by the controller 116, first token component 107-1, and/or file register 111 shown in FIG. 1) of the indicator 571-1 may validate a first close transaction token 557-1 stored by the host (e.g., in the file register 111 or in the first token component 107-1) that corresponds to the first open transaction token 556-1. Validation of the first close transaction token 557-1 may be used to indicate completion of the programming of upper page 1 at 569-1 and upper page 2 at 569-2 associated with CMD1 564-1 and CMD2 564-2.

Subsequences of the example sequence 560 associated with an open transaction token 556 are not limited to only including two commands 564 (e.g., CMD1 564-1 and CMD2 564-2) being sent consecutively from the host 502 to the memory device 504. Nor are the subsequences associated with an open transaction token 556 limited to programming just one level of the MLCs and/or one type of page 569 (e.g., upper page 1 at 569-1 and upper page 2 at 569-2).

For example, FIG. 5 illustrates a second open transaction token 556-2 being associated with CMD3 at 564-3, CMD4 at 564-4, CMD5 at 564-5, CMD6 at 564-6, CMD7 at 564-7, and CMD8 at 564-8. Consistent with the instructions included in these six commands 564-3, . . . , 564-8, upper page 3 (e.g., of MLCs in row 3) at 569-3 may be programmed with data values responsive to CMD1 and upper page 4 (e.g., of MLCs in row 4) at 569-4 may be programmed with data values responsive to CMD4.

As shown in FIG. 5, subsequences of the example sequence 560 may include commands directed toward programming of different types of pages 569 being associated with the same open transaction token 556. For example, not only is programming of upper pages 3 and 4 associated with open transaction token 556-2, but also associated with open transaction token 556-2 are lower page 1 (e.g., of MLCs in row 1) at 569-5, which may be programmed with data values responsive to CMD5, lower page 2 (e.g., of MLCs in row 2) at 569-6, which may be programmed with data values responsive to CMD6, lower page 3 (e.g., of MLCs in row 3) at 569-7, which may be programmed with data values responsive to CMD7, and lower page 4 (e.g., of MLCs in row 4) at 569-8, which may be programmed with data values responsive to CMD8.

Upon completion of the programming of lower page 1 at 569-5 and lower page 2 at 569-6, the memory device 504 may be configured to output 562 to host 502 a first safety token 558-1 to indicate completion of programming of the data values associated with CMD5 and CMD6. The completion of the programming also indicates that interruption of electrical power (or another event that prevents programming) has not occurred between programming of upper pages 1 at 569-1 and 2 at 569-2, associated with CMD1 564-1 and CMD2 564-2, and paired lower pages 1 at 569-5 and 2 at 569-6, associated with CMD5 564-5 and CMD6 564-6. Moreover, the first safety token 558-1 also may indicate that, based on the programming of the paired lower pages 1 at 569-5 and 2 at 569-6 in the first and second rows being completed, data values programmed in the paired upper pages 1 at 569-1 and 2 at 569-2 of the respective first and second rows have a reduced probability of (e.g., are relatively safe from) unintended modification.

Included in the subsequence associated with the second open transaction token 556-2, the example sequence 560 may continue with programming of lower page 3 (e.g., of MLCs in row 3) at 569-7 with the data values responsive to CMD7 564-7 and programming of lower page 4 (e.g., of MLCs in row 4) at 569-8 with the data values responsive to CMD8 564-8. Upon completion of the programming of lower page 3 at 569-7 and lower page 4 at 569-8, the memory device 504 may be configured to output 562 to host 502 an indicator 571-2 of completion of CMD3, CMD4, CMD5, CMD6, CMD7, and CMD8.

Receipt by the host 502 of the indicator 571-2 may validate a second close transaction token 557-2 stored by the host (e.g., in the file register 111 or in the first token component 107-1) that corresponds to the second open transaction token 566-2. Validation of the second close transaction token 557-2 may be used to indicate completion of the programming of upper page 3 at 569-3 and upper page 4 at 569-4, associated with CMD3 564-3 and CMD4 564-4. Validation of the second close transaction token 557-2 also may be used to indicate completion of the programming of lower page 1 at 569-5, lower page 2 at 569-6, lower page 3 at 569-7, and lower page 4 at 569-8, associated respectively with CMD5 564-5, CMD6 564-6, CMD7 564-7, and CMD8 564-8. Alternatively or in addition, an indicator 571 may be output 562 to host 502 following completion of programming of upper page 4 to indicate completion of programming of upper page 3 and upper page 4 corresponding to CMD3 564-3 and CMD3 564-3.

Upon completion of the programming of lower page 4 at 569-8, the memory device 504 may be configured to output 562 to host 502 a second safety token 558-2 to indicate completion of programming of the data values associated with CMD7 564-7 and CMD8 564-8. The completion of the programming also indicates that interruption of electrical power (or another event that prevents programming) has not occurred between programming of upper pages 3 at 569-3 and 4 at 569-4, associated with CMD3 564-3 and CMD4 564-4, and paired lower pages 3 at 569-7 and 4 at 569-8, associated with CMD7 564-7 and CMD8 564-8. Moreover, the second safety token 558-2 also may indicate that, based on the programming of the paired lower pages 3 at 569-7 and 4 at 569-8 in the third and fourth rows being completed, data values programmed in the paired upper pages 3 at 569-3 and 4 at 569-4 of the respective third and fourth rows have a reduced probability of (e.g., are relatively safe from) unintended modification. Hence, the memory device 504 (e.g., controller 108) may be configured to delay output of a safety token applicable to completion of a particular command until a number of additional commands are completed such that the safety token indicates completion of programming associated with the particular command and the additional commands.

In a number of embodiments, receipt by the host 502 of a safety token 558 may result in cancellation of a respective open transaction token 556 (e.g., and a corresponding close transaction token 557) in the file register 111. For example, receipt of the first safety token 558-1 may result in cancellation of the first open transaction token 556-1 and receipt of the second safety token 558-2 may result in cancellation of the second open transaction token 556-2. The file register 111 may store indicators of the logical locations of the data values safely stored by the respective rows and upper and lower pages responsive to receipt of the respective safety tokens.

Accordingly, a memory device (e.g., as shown at 104 and described in connection with FIG. 1) may include an array of MLCs in memory. The array may, in a number of embodiments, be a NAND array of non-volatile MLCs arranged in rows. The array may be formed consistent with the embodiment shown at 110 and described in connection with FIG. 1, the embodiment shown at 220 and described in connection with FIG. 2, the embodiment shown at 325 and described in connection with FIG. 3A, and/or the embodiment shown at 340 and described in connection with FIG. 3B, among other possible embodiments of memory consistent with the present disclosure.

The MLCs 342 in the array may each be configured to store a number of data values corresponding to a respective number of lower pages and to store a data value corresponding to an upper page in a first row. For example, in the first row (e.g., WL1 326-1) of the NAND array 340 of four level (e.g., four bit) non-volatile memory cells shown in FIG. 3B, MLC 342-0 may include LP1 343-0, LP2 344-0, LP3 345-0, and UP 346-0. Similarly, MLC 342-1 of the first row may include LP1 343-1, LP2 344-1, LP3 345-1, and UP 346-1. The first row may include any number of four level MLCs (e.g., 1,024, 2,048, 4,096, 8,192, or 16,384, among other possible numbers of memory cells that do not correspond to a power of 2). A total number of lower page levels LP1 343-0, LP1 343-1, etc., corresponding to the number of MLCs 342 (e.g., 342-0, 342-1, etc.) in the first row 326-1 may be termed a first page of the first row 326-1. A total number of lower page levels LP2 344-0, LP2 344-1, etc., corresponding to the number of MLCs 342 in the first row 326-1 may be termed a second page of the first row 326-1. Similarly, a total number of lower page levels LP3 345-0, LP2 345-1, etc., corresponding to the number of MLCs 342 in the first row 326-1 may be termed a third page of the first row 326-1. A total number of upper page levels UP 346-0, LP2 346-1, etc., corresponding to the number of MLCs 342 in the first row 326-1 may be termed a fourth page of the first row 326-1. Four pages using the LP1s 343, LP2s 344, LP3s 345, and UPs 346 of the MLCs 342 in each of rows 326-2, 326-3, ..., 326-N may be formed similarly.

A number of embodiments may have fewer than four levels (e.g., two or three levels) in each MLC 342 or may have more than four levels (e.g., five or more levels) in each MLC 342 such that the number of pages per row may correspond to the number of levels. Moreover, the numbering of the pages may be reversed. For example, the lower page levels LP1 343-0, LP1 343-1, etc., may be termed a fourth page of the first row 326-1 and upper page levels UP 346-0, LP2 346-1, etc., may be termed a first page of the first row 326-1. With two level MLCs, for example, the lower page levels may be termed a first page and the upper page levels may be termed a second page, or vice versa.

A controller (e.g., as shown at 108 and described in connection with FIG. 1) may be coupled to the array of MLCs. The controller may, in a number of embodiments, be configured to direct programming of the upper page in the first row responsive to receipt of a first command (e.g., CMD1 shown at 564-1 and described in connection with FIG. 5) including a number of data values to be stored by the upper page (e.g., upper page 1 shown at 569-1 and described in connection with FIG. 5). The first command may be associated with a first open transaction token (e.g., as shown at 456 and 556-1 and described in connection with FIG. 4 and FIG. 5, respectively).

The controller may be further configured to direct programming of a particular one of a number of lower pages (e.g., the second page for two level MLCs or the fourth page for four level MLCs) in the first row responsive to receipt of a second command (e.g., CMD5 shown at 564-5 and described in connection with FIG. 5) including a number of data values to be stored by the particular lower page. In the example illustrated in FIG. 5, the particular one of the lower pages may be lower page 1 shown at 569-5. The controller may be further configured to direct output of a first safety token (e.g., as shown at 458 and 558-1 and described in connection with FIG. 4 and FIG. 5, respectively) to indicate completion of programming of the particular one of the number of lower pages in the first row.

The first safety token may result in cancellation of the first open transaction token and may indicate that the programming of the particular one of the lower pages in the first row is completed. For example, responsive to receipt of the safety token by the host 502, completion of the programming of the particular one of the lower pages in the first row is confirmed and the first open transaction token is cancelled. The first safety token may further indicate that the programming of the upper page in the first row was completed prior to completion of the programming of the particular one of the lower pages. The first safety token may further indicate that data values programmed in the upper page have a reduced probability of unintended modification as a result of completion of the data values being programmed in the particular one of the lower pages in the first row. The reduced probability may be relative to a probability of unintended modification of the data values if the particular one of the lower pages remains unprogrammed. Responsive to the particular one of the lower pages not remaining unprogrammed, for example, by interruption of energy (e.g., electrical power) being supplied to the memory device that includes the array following the programming of the upper page, the first safety token may be output to indicate that interruption of energy has not occurred prior to the completion of the programming of the particular one of the lower pages.

In a number of embodiments, the first command (e.g., CMD1 shown at 564-1 and described in connection with FIG. 5) may be followed by a third command (e.g., CMD2 shown at 564-2) to direct programming of an upper page in a second row (e.g., upper page 2 shown at 569-1). The first command and the third command both may be associated with a second open transaction token (e.g., which may be the same as the first open transaction token shown at 556-1). The controller of the memory device may be further configured to output an indicator (e.g., as shown at 571-1) responsive to completion of the programming of the upper page in the first row and the upper page in the second row (e.g., upper pages 569-1 and 569-2).

The third command (e.g., CMD2 shown at 564-2) may be followed by a fourth command (e.g., CMD6 shown at 564-6) to direct programming of a particular one of a number of lower pages in the second row (e.g., lower page 2 shown at 569-6). The controller may be further configured to direct output of the first safety token (e.g., shown at 558-1) to indicate completion of programming of the particular one of the number of lower pages in the first row (e.g., lower page 569-5) and programming of the particular one of the number of lower pages in the second row (e.g., lower page 569-6). Receipt of the first safety token 558-1 may result in cancellation of the second open transaction token (e.g., the first open transaction token shown at 556-1). The first safety token 558-1 also may indicate that the programming of the particular one of the lower pages in the first and second rows (e.g., lower pages 569-5 and 569-6) is completed and that data values programmed in the upper pages of the first and second rows (e.g., upper pages 569-1 and 569-2) have a reduced probability of unintended modification.

A computing system (e.g., as shown at 100 and described in connection with FIG. 1) may include a host (e.g., as shown at 102) configured to generate commands for storage of data values. The computing system 100 may further include a memory device (e.g., as shown at 104) coupled to the host 102. The memory device 104 may include an array of MLCs (e.g., as shown at 110, 220, 325, and 340). Each of the MLCs may be configured to store a data value corresponding to a first page (e.g., upper page 1 at 569-1) in a particular row and to store a data value corresponding to a second page (e.g., lower page 1 at 569-5) in the particular row. A total number of MLCs in the first row may correspond to the respective numbers of data values to be stored by each of the first page and the second page.

A controller (e.g., as shown at 108) may be coupled to the array. The controller may be configured to direct programming of the first page (e.g., upper page 1 at 569-1) in a first row responsive to receipt from the host of a first command (e.g., CMD1 at 564-1) including a number of data values to be stored by the first page. The first command may be associated with a first open transaction token (e.g., as shown at 556-1). An open transaction token may originate in the host in association with a command to program at least a number of first pages of a corresponding number of rows of the array. For example, the first open transaction token 556-1 shown in FIG. 5 is associated with CMD1 564-1 and CMD2 564-2 for programming of upper page 1 569-1 in row 1 and for programming upper page 2 569-1 in row 2, respectively. The second open transaction token 556-2 shown in FIG. 5 is associated with CMD3 564-3 and CMD4 564-4 for programming of upper page 1 569-3 in row 3 and for programming upper page 4 569-4 in row 4, respectively. In addition, the second open transaction token 556-2 may be associated with CMD5 569-5 for programming of lower page 1 569-5 in row 1, CMD6 569-6 for programming of lower page 2 569-6 in row 2, CMD7 569-7 for programming of lower page 3 569-7 in row 3, and CMD8 569-8 for programming of lower page 4 569-8 in row 4.

The controller may be further configured to direct programming of a second page (e.g., lower page 1 at 569-5) in the first row responsive to receipt from the host of a second command (e.g., CMD5 at 564-5) including a number of data values to be stored by the second page. The controller may be further configured to direct that a first safety token (e.g., as shown at 558-1) be sent to the host to indicate completion of programming of the second page in the first row. The first safety token may be sent (e.g., by the controller) to the host to indicate completion of the second command (e.g., CMD5 at 564-5 and CMD6 at 564-6) to program a number of second pages (e.g., pages 569-5 and 569-6) associated with the number of first pages (e.g., pages 569-1 and 569-2) encapsulated by the first open transaction token (e.g., shown at 556-1) and a first close transaction token (e.g., shown at 557-1).

The first safety token may be associated with (e.g., include) an indicator of a logical location of each of the data values stored by the first page and the second page in the array. The safety token sent to the host may indicate that the programming of the second page in the first row is completed. The safety token sent to the host also may result in cancellation of the first open transaction token.

An indicator (e.g., as shown at 571-1 and/or 571-2) may be sent by (or directed to be sent by) the controller to the host to indicate completion of the first command to program at least the number of first pages of the corresponding number of rows. For example, indicator 571-1 may indicate completion of CMD1 564-1 and CMD2 564-2 to program upper page 1 569-1 and upper page 2 569-2, respectively, associated with the first open transaction toke 556-1. Indicator 571-2 may, in a number of embodiments, indicate completion of CMD3 564-3 and CMD4 564-2 to program upper page 3 569-3 and upper page 4 569-4, respectively, associated with the second open transaction toke 556-2. Alternatively, indicator 571-2 may indicate completion of CMDs 3-8 to program upper pages 3 and 4 in addition to lower pages 1-4 associated with the second open transaction toke 556-2. Indicator 571-1 may validate a first close transaction token 557-1 that corresponds to the first open transaction token 556-1 and indicator 571-2 may validate a second close transaction token 557-1 stored by the host that corresponds to the second open transaction token 556-2.

As described herein, a safety token (e.g., the first safety token shown at 558-1) may indicate that the data values programmed in a first page (e.g., page 569-1) have a reduced probability of unintended modification as a result of interruption of energy (e.g., electrical power) supplied to the memory device relative to a second page (e.g., paired page 569-5) remaining unprogrammed. For example, receipt of the safety token by the host may indicate that data values programmed in the first page have a reduced probability of unintended modification as a result of completion of the data values being programmed in the second page in the first row relative to the second page remaining unprogrammed.

The first command (e.g., CMD1 at 564-1 for programing upper page 1 in row 1) may be followed by a third command to direct programming of a first page in a second row (e.g., CMD2 at 564-2 for programing upper page 2 in row 2). The first command and the third command may be associated with a second open transaction token (e.g., the first open transaction token shown at 556-1). The third command may be followed by a fourth command (e.g., CMD6 at 564-6) to direct programming of a second page in the second row (e.g., lower page 2 at 569-6). The controller may be further configured to send the first safety token 558-1 for CMD1 564-1 and CMD2 564-2 to the host to indicate completion of programming of the second page in the first row and programming of the second page in the second row (e.g., lower pages 569-5 and 569-6).

Responsive to receipt of the first safety token 558-1 by the host, the second open transaction token (e.g., as shown at 556-1) may be cancelled. Responsive to receipt of the first safety token 558-1, a file register (e.g., shown at 111) of the host may be directed (e.g., by controller 118) to store indicators of the logical locations of the data values stored by the first page and the second page in each of the respective first and second rows. The indicators of the logical locations of each of the data values in the first page being stored by the file register may indicate that the data values in first page have a reduced probability of unintended modification as a result of interruption of energy supplied to the memory device.

Receipt of the safety token may indicate to the host that the data values have been stored by non-volatile MLCs corresponding to the first page and the second page and that the stored data values are protected from unintended modification as a result of interruption of energy supplied to the memory device. In contrast, not receiving (e.g., non-receipt of) the safety token may indicate to the host that the data values have not been stored by at least the second page of the MLCs. Consequently, the host may be configured to determine that no further commands for storage of data values will be sent to the memory device. The host may be further configured to delay the commands for storage of data values being sent to the memory device until restoration of energy being supplied to the memory device (e.g., by the host 102 being configured to monitor the characteristics of the energy source 101, as described elsewhere herein).

Figure 6:
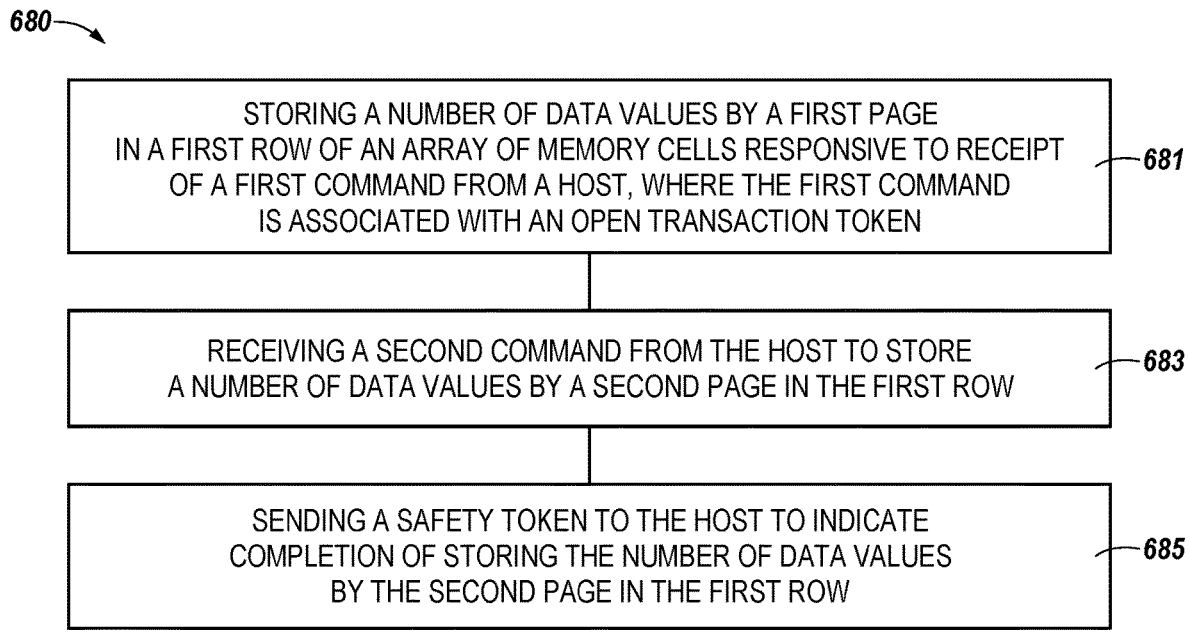
FIG. 6 is a flow diagram of an example method for using the tokens to indicate completion of data storage to memory in accordance with a number of embodiments of the present disclosure.

FIG. 6 is a flow diagram of an example method 680 for using the tokens to indicate completion of data storage to memory in accordance with a number of embodiments of the present disclosure. The method 680 can be performed by processing logic that can include hardware and/or firmware (e.g., processing device, circuitry, dedicated logic, programmable logic, microcode, hardware of a device, integrated circuit, etc.), software (e.g., instructions run or executed on a processing device), or a combination thereof. Unless explicitly stated, elements of methods described herein are not constrained to a particular order or sequence. Additionally, a number of the method embodiments, or elements thereof, described herein may be performed at the same, or at substantially the same, point in time.

The method 680 may be performed, in a number of embodiments, using the controller 108 of the memory device 104 and/or the controller 116 of the host 102 (e.g., in combination with memory 110 and/or a processor 114), as shown and described in connection with FIG. 1. The operations described herein (e.g., storing, sending, cancelling, recording, cancelling, detecting, etc.) performed by the memory device 104 and/or the host 102, using the circuitry, memory, controllers, and/or processors associated therewith, are enabled by execution of instructions stored on a computer readable medium (CRM). The CRM may, in a number of embodiments, be stored on tangible hardware, firmware, and/or software that may be part of, directly coupled to, and/or indirectly coupled to (e.g., operably coupled to) the controllers, memory, and/or processors of the memory device 104 and the host 102. For example, the controller 108 and/or memory 110 of the memory device 104 may include, or be operably coupled to, CRM including instructions executable to direct performance of generation and/or output of tokens 107-2 (e.g., via interface 106). The controller 116 and/or processor 114 of the host 102 may include, or be operably coupled to, CRM including instructions executable to direct performance of receipt of the tokens 107-2 (e.g., via interface 118). The CRM may further include, in a number of embodiments, instructions executable to direct use of the tokens 107-2 (e.g., a safety token as shown at 458 and described in connection with FIG. 4) by the controller 116.

At block 681, the method 680 may include storing a number of data values by a first page in a first row of an array of memory cells responsive to receipt of a first command from a host (e.g., as shown and described in connection with FIGS. 3B and 5 and elsewhere herein). The first command may be associated with an open transaction token (e.g., as shown and described in connection with FIGS. 4 and 5 and elsewhere herein). At block 683, the method 680 may include receiving a second command from the host to store a number of data values by a second page in the first row (e.g., as shown and described in connection with FIGS. 3B and 5 and elsewhere herein). At block 685, the method 680 may include sending a safety token to the host to indicate completion of storing the number of data values by the second page in the first row (e.g., as shown and described in connection with FIGS. 4 and 5 and elsewhere herein).

The method 680, in a number of embodiments, further include cancelling (e.g., by the host) the open transaction token responsive to receipt of the safety token to indicate the completion of storing the number of data values by the second page (e.g., as shown and described in connection with FIGS. 4 and 5 and elsewhere herein). The method 680 may further include recording (e.g., by the host) the completion of storing the number of data values by the first and second pages in the first row conditionally responsive to matching the open transaction token with a received safety token. For example, cancellation of a particular open transaction token (e.g., the first open transaction token 556-1 or the second open transaction token 556-2 shown in FIG. 5) may be dependent upon the host (e.g., the controller thereof) receiving a matching safety token from the memory device (e.g., the respective first safety token 558-1 or the respective second safety token 558-2). The method 680 may further include detecting (e.g., by the host) an interruption of energy (e.g., electrical power) supplied to the array based on no match of the open transaction token with a received safety token. The method 680 may further include the safety token indicating that the data values stored by the first page have a reduced probability of unintended modification as a result of interruption of energy supplied to the array relative to data values not being stored by the second page.

The method 680 may further include delaying (e.g., by the host) sending commands for storage of data values to the memory device including the array of memory cells based on a determination of no match of the open transaction token with a received safety token (e.g., as shown and described in connection with FIG. 5 and elsewhere herein). The method 680 may further include the memory device not including backup data storage components due to the sending of the commands for storage of data values being delayed. For example, the system 100 and/or the memory device 104 may, in an number of embodiments, not include the backup data storage components because the system (e.g., the host 102) may be configured, responsive to non-receipt of safety tokens, as described herein, to delay the commands for storage of data values being sent to the memory device (e.g., until restoration of energy being supplied to the memory device). Hence, because the commands for storage of data values are not being received by the memory device when, for example, a supply of electrical power from the energy source is interrupted, potential use of data values stored by the backup data storage components may be reduced (e.g., eliminated).

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. Moreover, the structural features illustrated in the accompanying drawings are intended to indicate relative positioning of the structural features in one or more embodiments and are not necessarily drawn to scale relative to other structural features in the drawings or otherwise.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically for access to and/or for movement (transmission) of instructions (e.g., control signals, address signals, etc.) and data, as appropriate to the context.

While example embodiments including various combinations and configurations of energy sources, hosts, memory devices, controllers, memory arrays, MLCs, tokens, token components, indicators, file registers, among other materials and/or components related to tokens to indicate completion of data storage to memory, have been illustrated and described herein, embodiments of the present disclosure are not limited to those combinations explicitly recited herein. Other combinations and configurations of the energy sources, hosts, memory devices, controllers, memory arrays, MLCs, tokens, token components, indicators, and/or file registers related to tokens to indicate completion of data storage to memory than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   storing a number of data values by a first page in a first row of an array of memory cells responsive to receipt of a first command from a host, wherein the first command is associated with an open transaction token;
   receiving a second command from the host to store a number of data values by a second page in the first row; and
   sending a safety token to the host to indicate completion of storing the number of data values by the second page in the first row, the safety token indicating that the data values stored by the first page have a reduced probability of unintended modification as a result of interruption of energy supplied to the array relative to data values not being stored by the second page.

2. The method of claim 1, wherein the method further comprises:
   cancelling the open transaction token responsive to receipt of the safety token to indicate the completion of storing the number of data values by the second page; and
   recording the completion of storing the number of data values by the first and second pages in the first row conditionally responsive to matching the open transaction token with a received safety token.

3. The method of claim 1, wherein the method further comprises detecting an interruption of energy supplied to the array based on no match of the open transaction token with a received safety token.

4. The method of claim 1, wherein the method further comprises delaying sending commands for storage of data values to a memory device comprising the array of memory cells based on a determination of no match of the open transaction token with a received safety token.

5. The method of claim 4, wherein the memory device does not include backup data storage components due to the sending of the commands for storage of data values being delayed.

6. An apparatus, comprising:
   an array of multilevel memory cells, wherein the respective cells are each configured to store a number of data values corresponding to a respective number of lower pages and to store a data value corresponding to an upper page in a first row; and
   a controller coupled to the array, wherein the controller is configured to:
      direct programming of the upper page in the first row responsive to receipt of a first command including a number of data values to be stored by the upper page, wherein the first command is associated with a first open transaction token;
      direct programming of a particular one of the number of lower pages in the first row responsive to receipt of a second command including a number of data values to be stored by the particular lower page; and
      output a safety token to indicate completion of programming of the particular one of the number of lower pages in the first row, wherein the safety token further indicates that data values programmed in the upper page have a reduced probability of unintended modification as a result of the completion of the data values being programmed in the particular one of the lower pages in the first row relative to the particular one of the lower pages remaining unprogrammed.

7. The apparatus of claim 6, wherein:
   responsive to receipt of the safety token by a host:
      the completion of the programming of the particular one of the lower pages in the first row is confirmed; and
      the first open transaction token is cancelled.

8. The apparatus of claim 6, wherein the safety token further indicates that the programming of the upper page in the first row was completed prior to the completion of the programming of the particular one of the lower pages.

9. The apparatus of claim 6, wherein:
   responsive to the particular one of the lower pages not remaining unprogrammed by interruption of energy supplied to a memory device that comprises the array following the programming of the upper page:
      the safety token is output to indicate that the interruption of energy has not occurred prior to the completion of the programming of the particular one of the lower pages.

10. The apparatus of claim 6, wherein:
    the first command is followed by a third command to direct programming of an upper page in a second row, wherein the first command and the third command are associated with a second open transaction token; and
    the controller is further configured to output an indicator responsive to completion of the programming of the upper page in the first row and the upper page in the second row.

11. The apparatus of claim 10, wherein:
    the third command is followed by a fourth command to direct programming of a particular one of a number of lower pages in the second row; and
    the controller is further configured to output the safety token to indicate completion of programming of the particular one of the number of lower pages in the first row and programming of the particular one of the number of lower pages in the second row;

wherein the safety token cancels the second open transaction token and indicates that the programming of the particular one of the lower pages in the first and second rows is completed and that data values programmed in the upper pages of the first and second rows have a reduced probability of unintended modification.

12. The apparatus of claim 6, wherein the controller is further configured to delay output of the safety token applicable to completion of a particular command until a number of additional commands are completed such that the safety token indicates completion of programming associated with the particular command and the additional commands.

13. The apparatus of claim 6, wherein the array is a NAND array of non-volatile multilevel memory cells arranged in rows.

14. An apparatus, comprising:
an array of multilevel memory cells, wherein the respective cells are each configured to store a number of data values corresponding to a respective number of lower pages and to store a data value corresponding to an upper page in a first row; and
a controller coupled to the array, wherein the controller is configured to:
direct programming of the upper page in the first row responsive to receipt of a first command including a number of data values to be stored by the upper page, wherein the first command is associated with a first open transaction token;
direct programming of a particular one of the number of lower pages in the first row responsive to receipt of a second command including a number of data values to be stored by the particular lower page; and
output a safety token to indicate completion of programming of the particular one of the number of lower pages in the first row, wherein:
responsive to the particular one of the lower pages not remaining unprogrammed by interruption of energy supplied to a memory device that comprises the array following the programming of the upper page:
the safety token is output to indicate that the interruption of energy has not occurred prior to the completion of the programming of the particular one of the lower pages.

15. An apparatus, comprising:
an array of multilevel memory cells, wherein the respective cells are each configured to store a number of data values corresponding to a respective number of lower pages and to store a data value corresponding to an upper page in a first row; and
a controller coupled to the array, wherein the controller is configured to:
direct programming of the upper page in the first row responsive to receipt of a first command including a number of data values to be stored by the upper page, wherein the first command is associated with a first open transaction token;
direct programming of a particular one of the number of lower pages in the first row responsive to receipt of a second command including a number of data values to be stored by the particular lower page; and
output a safety token to indicate completion of programming of the particular one of the number of lower pages in the first row, wherein the first command is followed by a third command to direct programming of an upper page in a second row,
wherein the first command and the third command are associated with a second open transaction token; and
output an indicator responsive to completion of the programming of the upper page in the first row and the upper page in the second row.

16. A system, comprising:
a host configured to generate commands for storage of data values; and
a memory device coupled to the host, wherein the memory device comprises:
an of array memory cells, wherein the respective cells are each configured to store a data value corresponding to a first page and to store a data value corresponding to a second page of a particular row; and
a controller coupled to the array, wherein the controller is configured to:
direct programming of the first page in a first row responsive to receipt from the host of a first command including a number of data values to be stored by the first page, wherein the first command is associated with a first open transaction token;
direct programming of a second page in the first row responsive to receipt from the host of a second command including a number of data values to be stored by the second page; and
send a safety token to the host to indicate completion of programming of the second page in the first row, wherein the safety token is associated with an indicator of a logical location of each of the data values stored by the first page and the second page;
wherein the safety token sent to the host cancels the first open transaction token and indicates that the programming of the second page in the first row is completed, wherein a file register of the host stores the indicators of the logical locations of the data values stored by the first page and the second page responsive to receipt of the safety token, and wherein indicators of the logical locations of each of the data values in the first page being stored by the file register indicate that the data values in first page have a reduced probability of unintended modification as a result of interruption of energy supplied to the memory device.

17. The system of claim 16, wherein a total number of memory cells in the first row corresponds to the respective numbers of data values to be stored by each of the first page and the second page.

18. The system of claim 16, wherein an open transaction token originates in the host in association with a command to program at least a number of first pages of a corresponding number of rows of the array.

19. The system of claim 16, wherein:
an indicator is sent by the controller to the host to indicate completion of the first command to program at least the number of first pages of the corresponding number of rows; and
the indicator validates a close transaction token stored by the host that corresponds to the first open transaction token.

20. The system of claim 16, wherein the safety token is sent by the controller to the host to indicate completion of the second command to program a number of second pages associated with the number of first pages encapsulated by the first open transaction token and a close transaction token.

21. The system of claim 16, wherein:
receipt of the safety token indicates to the host that:
    the data values have been stored by non-volatile memory cells corresponding to the first page and the second page; and
    the stored data values are protected from unintended modification as a result of interruption of energy supplied to the memory device.

22. The system of claim 16, wherein:
non-receipt of the safety token indicates to the host that:
    the data values have not been stored by at least the second page of the memory cells; and
    no further commands for storage of data values be sent to the memory device.

23. The system of claim 22, wherein the host is further configured to delay the commands for storage of data values being sent to the memory device until restoration of energy supplied to the memory device.

24. The system of claim 16, wherein:
the first command is followed by a third command to direct programming of a first page in a second row, wherein the first command and the third command are associated with a second open transaction token;
the third command is followed by a fourth command to direct programming of a second page in the second row;
the controller is further configured to send the safety token to the host to indicate completion of programming of the second page in the first row and programming of the second page in the second row; and
responsive to receipt of the safety token by the host:
    the second open transaction token is cancelled; and
    a file register of the host stores indicators of logical locations of the data values stored by the first page and the second page in each of the respective first and second rows.

25. A system, comprising:
a host configured to generate commands for storage of data values; and
a memory device coupled to the host, wherein the memory device comprises:
    an of array memory cells, wherein the respective cells are each configured to store a data value corresponding to a first page and to store a data value corresponding to a second page of a particular row; and
    a controller coupled to the array, wherein the controller is configured to:
        direct programming of the first page in a first row responsive to receipt from the host of a first command including a number of data values to be stored by the first page, wherein the first command is associated with a first open transaction token;
        direct programming of a second page in the first row responsive to receipt from the host of a second command including a number of data values to be stored by the second page; and
        send a safety token to the host to indicate completion of programming of the second page in the first row, wherein the safety token is associated with an indicator of a logical location of each of the data values stored by the first page and the second page;
wherein the safety token sent to the host cancels the first open transaction token and indicates that the programming of the second page in the first row is completed, wherein:
receipt of the safety token indicates to the host that:
    the data values have been stored by non-volatile memory cells corresponding to the first page and the second page; and
    the stored data values are protected from unintended modification as a result of interruption of energy supplied to the memory device.

26. A system, comprising:
a host configured to generate commands for storage of data values; and
a memory device coupled to the host, wherein the memory device comprises:
    an of array memory cells, wherein the respective cells are each configured to store a data value corresponding to a first page and to store a data value corresponding to a second page of a particular row; and
    a controller coupled to the array, wherein the controller is configured to:
        direct programming of the first page in a first row responsive to receipt from the host of a first command including a number of data values to be stored by the first page, wherein the first command is associated with a first open transaction token;
        direct programming of a second page in the first row responsive to receipt from the host of a second command including a number of data values to be stored by the second page; and
        send a safety token to the host to indicate completion of programming of the second page in the first row, wherein the safety token is associated with an indicator of a logical location of each of the data values stored by the first page and the second page;
wherein the safety token sent to the host cancels the first open transaction token and indicates that the programming of the second page in the first row is completed, wherein:
non-receipt of the safety token indicates to the host that:
    the data values have not been stored by at least the second page of the memory cells; and
    no further commands for storage of data values be sent to the memory device.

* * * * *